United States Patent
Ju

(10) Patent No.: US 6,530,788 B1
(45) Date of Patent: Mar. 11, 2003

(54) STRUCTURE OF A BALL GRID ARRAY IC SOCKET CONNECTION WITH SOLDER BALL

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 09/972,685

(22) Filed: Oct. 9, 2001

(51) Int. Cl.$^7$ .............................................. H01R 12/00
(52) U.S. Cl. ......................... 439/83; 439/876; 439/856
(58) Field of Search .............................. 439/70, 80–82, 439/852, 844, 876, 83, 856–857, 843, 851

(56) References Cited

U.S. PATENT DOCUMENTS

| | | | | |
|---|---|---|---|---|
| 4,598,963 A | * | 7/1986 | White et al. | 439/82 |
| 5,899,759 A | * | 5/1999 | Yeow et al. | 439/876 |
| 5,984,694 A | * | 11/1999 | Sinclair | 439/70 |
| 6,056,558 A | * | 5/2000 | Lin et al. | 439/83 |
| 6,352,437 B1 | * | 3/2002 | Tate | 439/83 |
| 6,371,784 B1 | * | 4/2002 | Scholz et al. | 439/71 |
| 6,394,819 B1 | * | 5/2002 | Mosser et al. | 439/83 |

* cited by examiner

Primary Examiner—P. Austin Bradley
Assistant Examiner—Felix D. Figueroa
(74) Attorney, Agent, or Firm—Leong C. Lei

(57) ABSTRACT

A Ball Grid Array IC Socket connection with solder ball is characterized in that the conductive plate is formed from bendable, flexible conductive thin plate surrounded to form slotted cylindrical tube for the insertion and clipping of IC pins. The slotted cylindrical tube is in the form of square shape, wherein the size of the tube diameter can tightly clip the ball wall of a solder ball, such that the tube opening mounted with the solder ball provides a tight connection. On the other end of the slotted cylindrical tube, remote from the end inserted with IC pins, at a position about half the height of the solder ball, an arc-shaped slit is provided so that a blocking plate is joined to the wall of the tube, and the blocking plate touches the top portion of the solder ball.

1 Claim, 6 Drawing Sheets

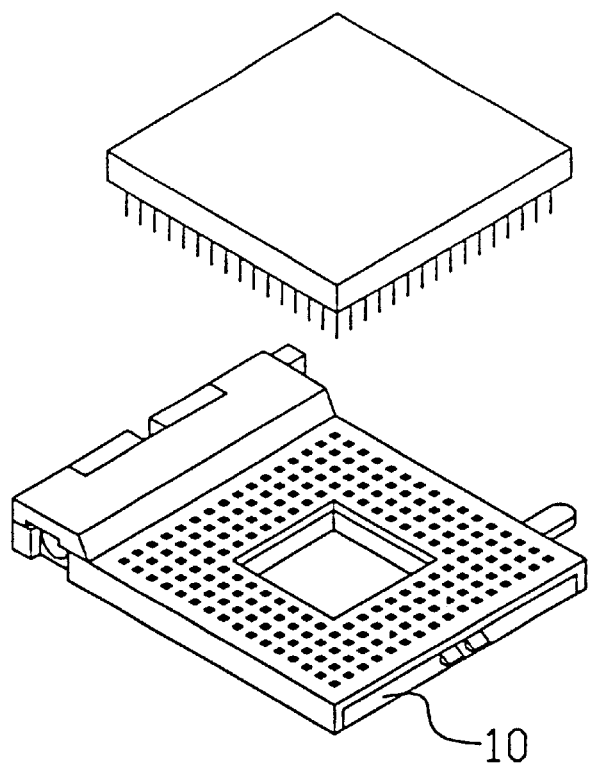
PRIOR ART
FIG. 1
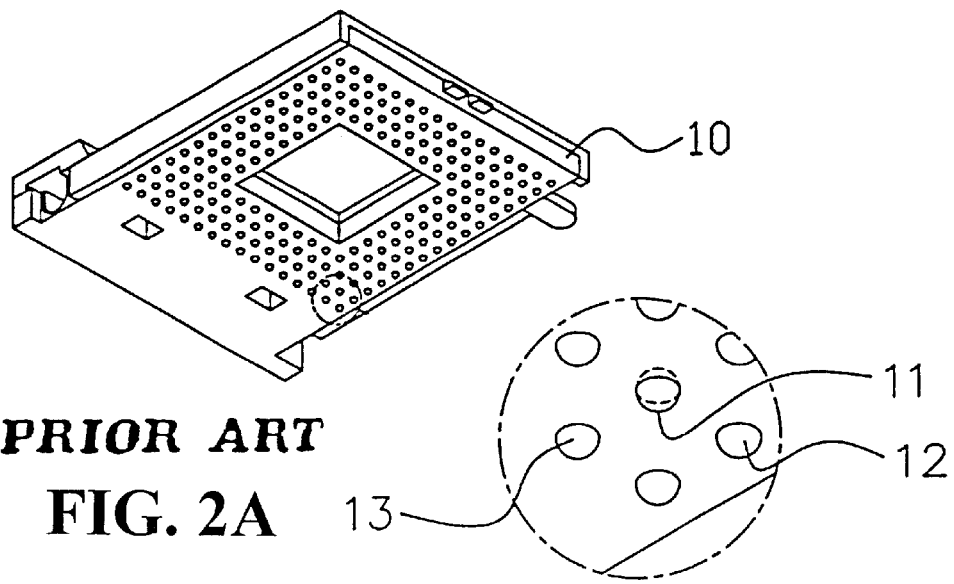
PRIOR ART
FIG. 2A
PRIOR ART
FIG. 2B

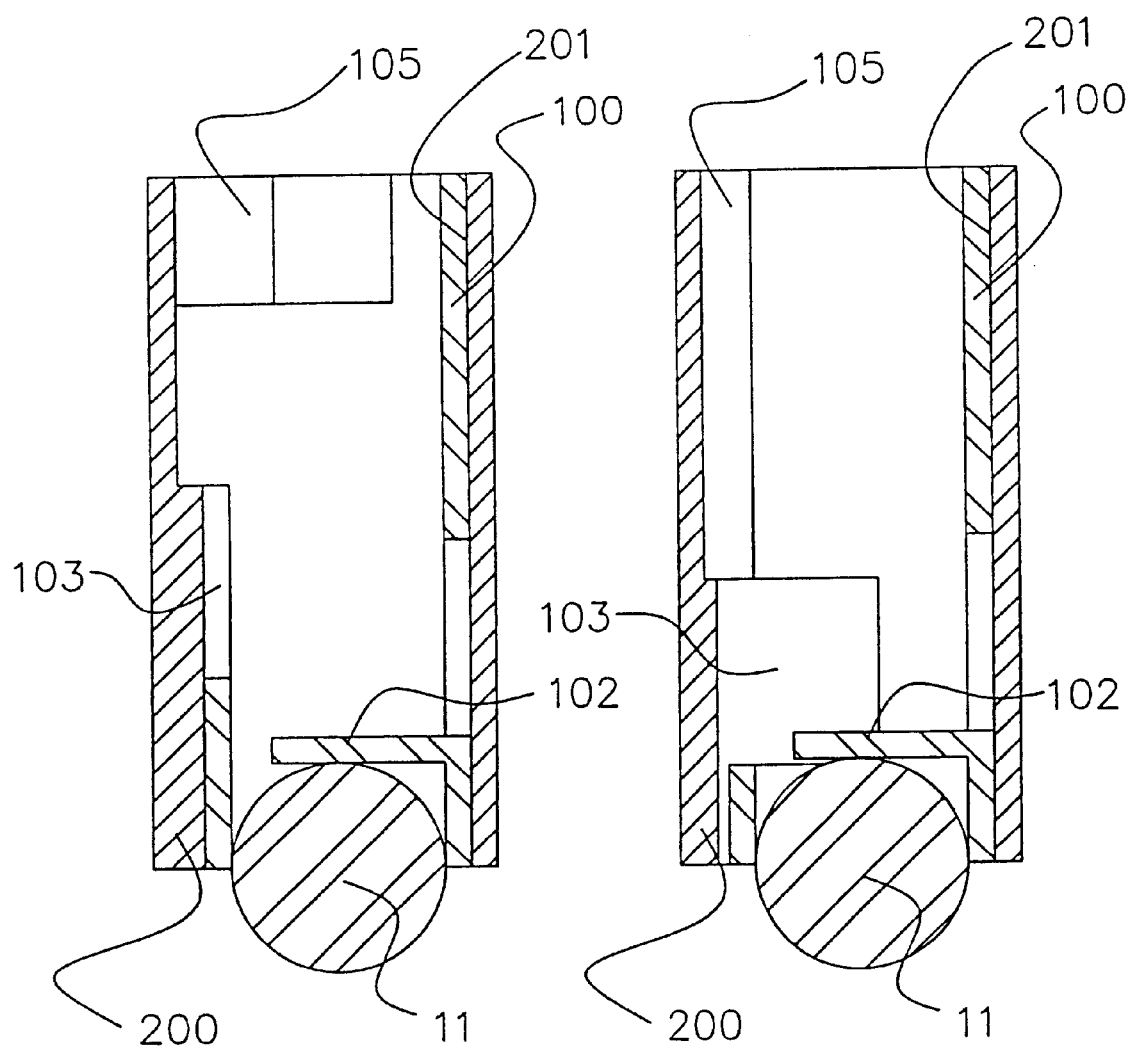
FIG. 6   FIG. 11
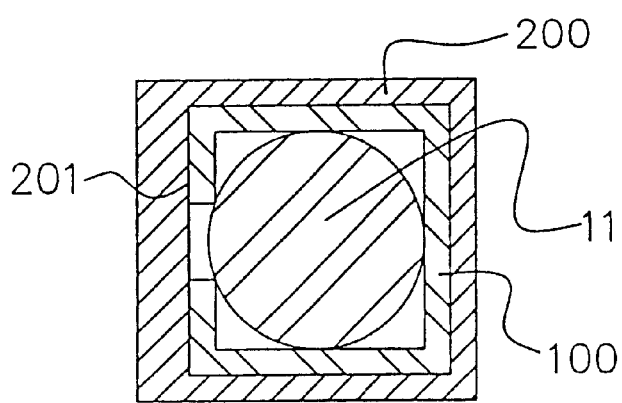
FIG. 7

STRUCTURE OF A BALL GRID ARRAY IC SOCKET CONNECTION WITH SOLDER BALL

BACKGROUND OF THE INVENTION (a) Field of the Invention

The present invention relates to an improved structure of a Ball Grid Array IC socket connection with solder ball, and in particular, an IC socket having a plurality of conductive clipping plates with clipping solder ball structure so as to eliminate the requirement of pre-soldering of solder ball onto the conductive clipping plates.

(b) Description of the Prior Art

Ball Grid Array IC socket is a new IC (integrated circuit) socket structure with solder balls to replace the insertion pins protruded from the bottom of the socket, and surface mounting technology is employed to mount the corresponding soldering position of the solder balls over the surface of the circuit board. FIG. 1 is a perspective view of Ball Grid Array CPU (central processing unit) socket. FIG. 2A is a bottom view of the socket shown in FIG. 1 and FIG. 2B is an enlarged view of a portion of FIG. 2A. The number of mounting pins of the corresponding IC pins of the socket is changed to a socket with semi-engaging solder balls 11, 12, 13 such that the bottom surface of the CPU socket 10 is protruded half the height of that of the solder balls 11, 12, 13.

FIG. 3 is a perspective view of a conventional Ball Grid Array CPU socket connected with solder ball. Within the socket 10, corresponding to IC pins, a plurality of straight slots 20, 21, 22 are formed. Each straight slot 20, 21, 22 is squeezed with a bendable, U-shaped conductive clipping plate 30 which is an elastic thin strap. The bottom end of the conductive clipping plate 30 does not protrude from the bottom of the socket 10, and a solder ball 40 is mounted to the bending section of the plate 30 such that the upper half portion of the solder ball 40 is engaged at the straight slot 20 and is mounted to the conductive clipping plate 30, and the lower half portion of the solder ball 40 is used for future mounting to a circuit board 50 at the soldering point. At an appropriate position on the two side walls of the conductive clipping plate 30, at least a pair of clipping walls 31, 32 is provided for clipping with the IC pins 61, 62 of a top transverse board 60 mounted onto the socket 10. This conductive plate 30 together with the ball solder 40 has the following drawbacks:

(1) A soldering process is required to pre-mount the solder ball onto a conductive clipping plate and after that when the CPU socket is be adhered to the circuit board, the solder ball has to be heated again, and accordingly, repeating of soldering processes is troublesome and the fabrication processes cannot be expedite; and (2) Due to numerous soldering points, chances of pollution due to air pollutant are increased and therefore the quality of conductivity at the soldered point is lowered, and further, the connection structure of the solder ball is inappropriate.

Accordingly, it is an object of the present invention to provide an improved structure of a Ball Grid Array IC socket connection with solder ball which mitigates the above drawbacks.

SUMMARY OF THE INVENTION

Accordingly, it is an object of the present invention to provide an improved structure of a Ball Grid Array IC socket connection with solder ball, wherein the conductive plate is formed from bendable, flexible conductive thin plate surrounded to form slotted cylindrical tube for the insertion and clipping of IC pins. The slotted cylindrical tube can be in the form of square shape, and in particular the tube opening at the other end of the slotted tube for the insertion of the IC pins, wherein the size of the tube diameter can tightly clip the ball wall of a solder ball, such that the tube opening mounted with the solder ball provides a tight connection. On the other end of the slotted cylindrical tube, remote from the end inserted with IC pins, at a position about half the height of the solder ball, an arc-shaped slit is provided so that a blocking plate is joined to the wall of the tube, and the blocking plate touches the top portion of the solder ball.

Yet another object of the present invention is to provide an improved structure of a Ball Grid Array IC socket connection with solder ball, wherein the IC socket is provided with a plurality of conductive clipping plates to connect with the solder ball, the surrounding of the inner wall of the wall block is a through slot allowing the mounting of the slotted cylindrical tube.

Other object and advantages of the present invention will become more apparent from the following description taken in conjunction with the accompanying drawing.

BRIEF DESCRIPTION OF THE DRAWINGS

FIG. 1 is a perspective view of a Ball Grid Array CPU socket.

FIG. 2A is a perspective view, viewing from the bottom of the socket of FIG. 1.

FIG. 2B is an enlarged view of a portion of FIG. 2A.

FIG. 6 is a sectional view along line VI—VI of FIG. 4 of the resent invention.

FIG. 7 is a sectional view along line VII—VII of FIG. 4 of the present invention.

FIG. 11 is a sectional view along line XI—XI of FIG. 9 of the present invention.

DETAILED DESCRIPTION OF THE PRESENT INVENTION

Figure 3:
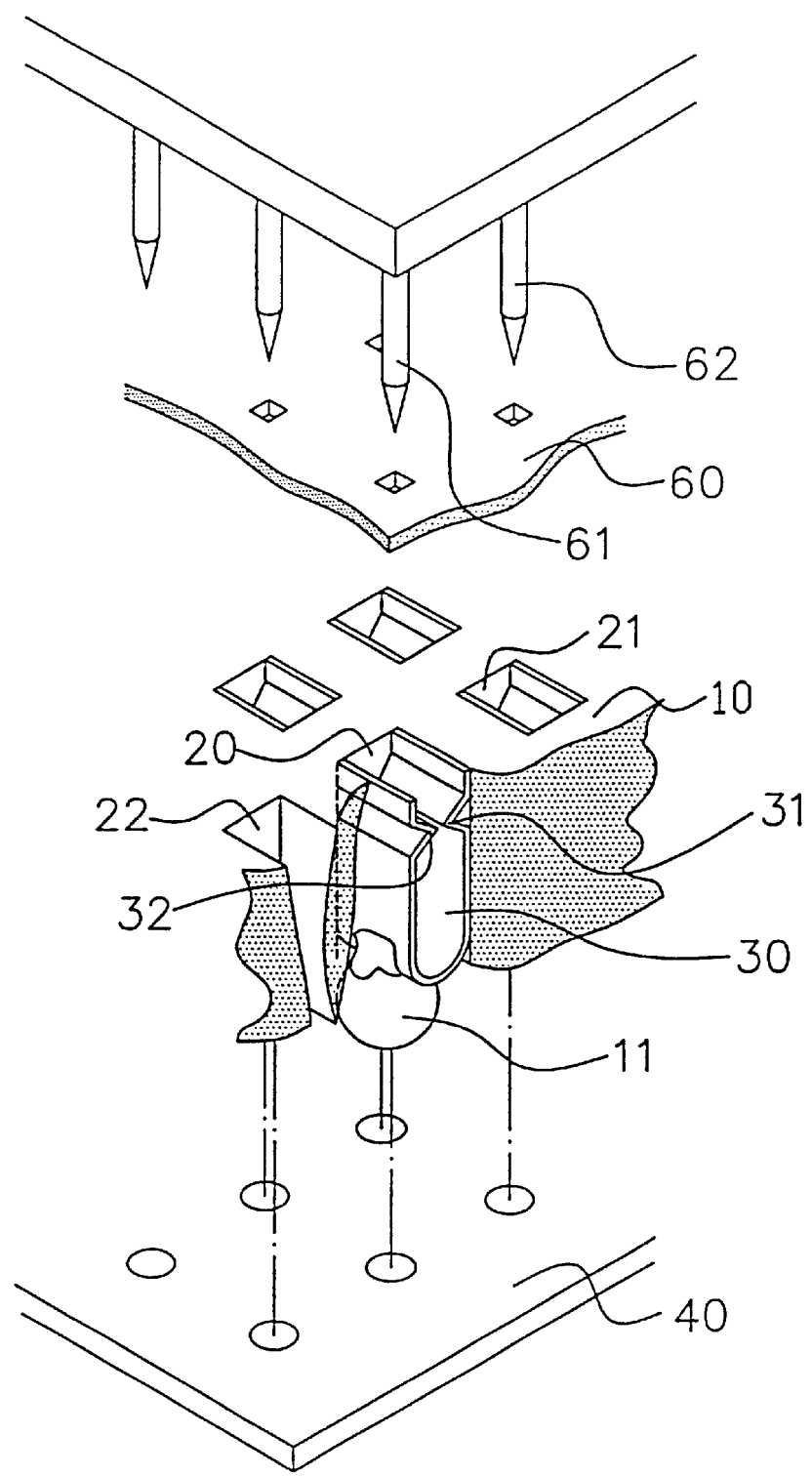
FIG. 3 is a perspective view of a conventional Ball Grid Array CPU socket connected with solder ball structure.

FIGS. 1 and 2A respectively show a perspective view and the bottom perspective view of a Ball Grid Array IC socket, and FIG. 3 is a perspective view of a conventional Ball Grid Array CPU socket connected with solder ball structure.

Figures 4, 5:
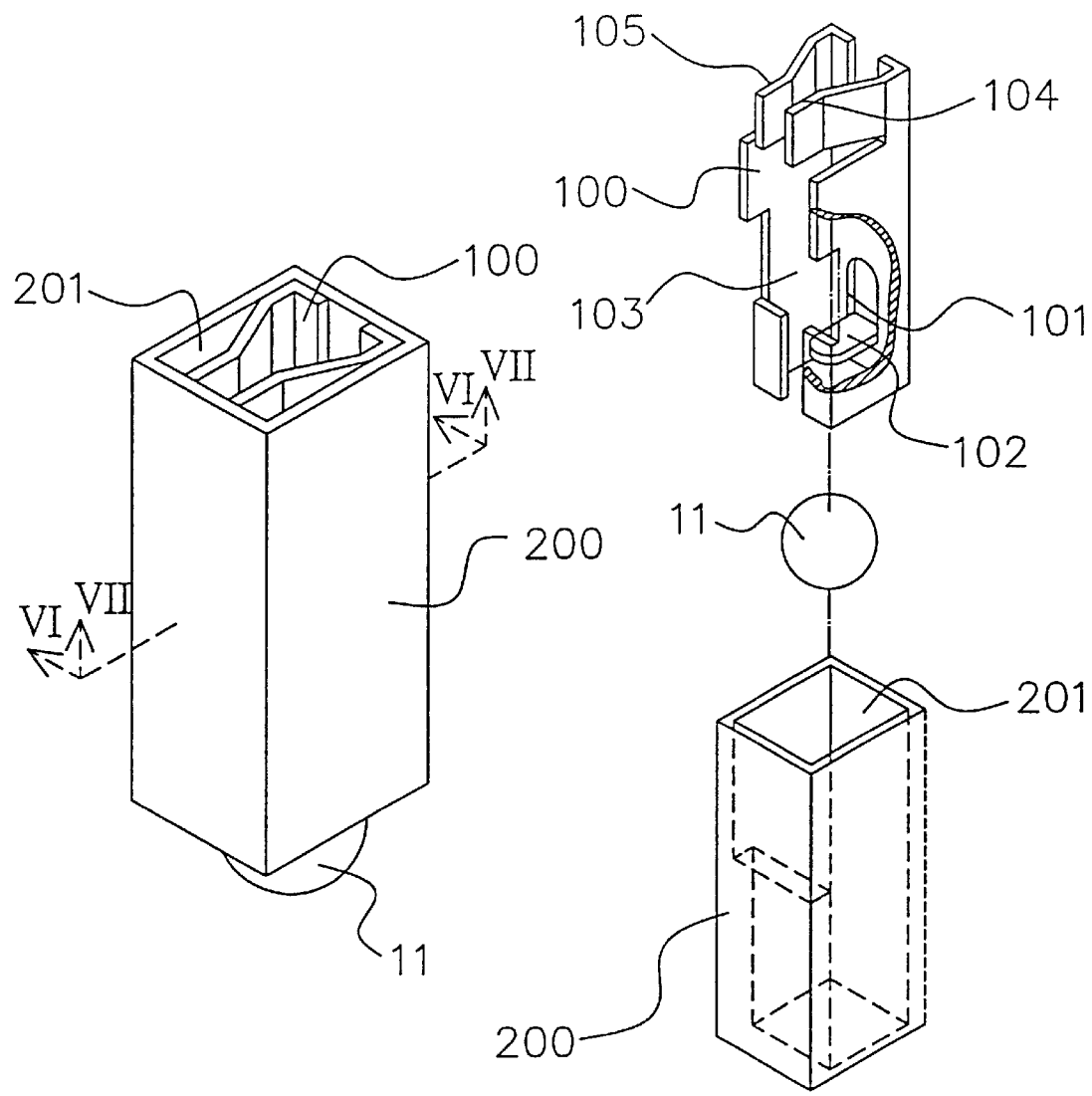
FIG. 4 is a perspective view showing the connection of the conductive clipping plate of the solder ball with the Ball Grid Array IC socket in accordance with the present invention.
FIG. 5 is a perspective exploded view showing the connection of the conductive clipping plate of the solder ball with the Ball Grid Array IC socket in accordance with the present invention.

Referring to FIGS. 4 and 5, there is shown a perspective view and a perspective exploded view of the connection of the conductive clipping plate of the solder ball with the Ball Grid Array IC socket in accordance with the present invention. As shown in the figures, within the IC socket, the conductive plate is formed from bendable, flexible conductive thin plate surrounded to form slotted cylindrical tube 100 for the insertion and clipping of IC pins. The slotted cylindrical tube 100 can be in the form of square shape, and in particular, the tube opening at the other end of the slotted tube 100 for the insertion of the IC pins is a square shape, wherein the size of the tube diameter can tighdy clip the ball wall of a solder ball 11, such that the tube opening mounted with the solder ball 11 provides a tight connection. On the other end of the slotted cylindrical tube 100, remote from the end inserted with IC pins, at a position about half the height of the solder ball 11, an arc-shaped slit 101 is provided so that a blocking plate 102 is joined to the wall of the tube 100, and the blocking plate 102 touches the top portion of the solder ball 11 in such a manner that half of the solder ball 11 is located below the height of the blocking plate 102. A through slot 103 is provided on the slotted cylindrical tube 100 and the end of the cylindrical tube 100 connected with the solder ball (a thin ring structure) is made into a thin rim structure with flexibility to clip and hold the solder ball 11. The end of the cylindrical tube 100 mounting with IC pins is provided with two clipping walls 104, 105 for insertion and clipping of IC pins. The exterior of the slotted cylindrical tube 100 can be directly engaged at the surrounding of a through slot of a wall block 200.

As shown in FIG. 5, the interior of the wall block 200 has a through slot 201 allowing the squeezing of the slotted cylindrical tube 100 therein. The shape of the through slot 201 can be varied based on the shape of the protruded surrounding of the cylindrical tube 100 and the size of the cylindrical tube 100 to allow the cylindrical tube 100 to closely fit within the through slot 201 without from dislocation therefrom. The wall block 200 is made from a non-conductive plastic material and complicated shape of through slot 201 can be formed on the plastic material.

Figure 8:
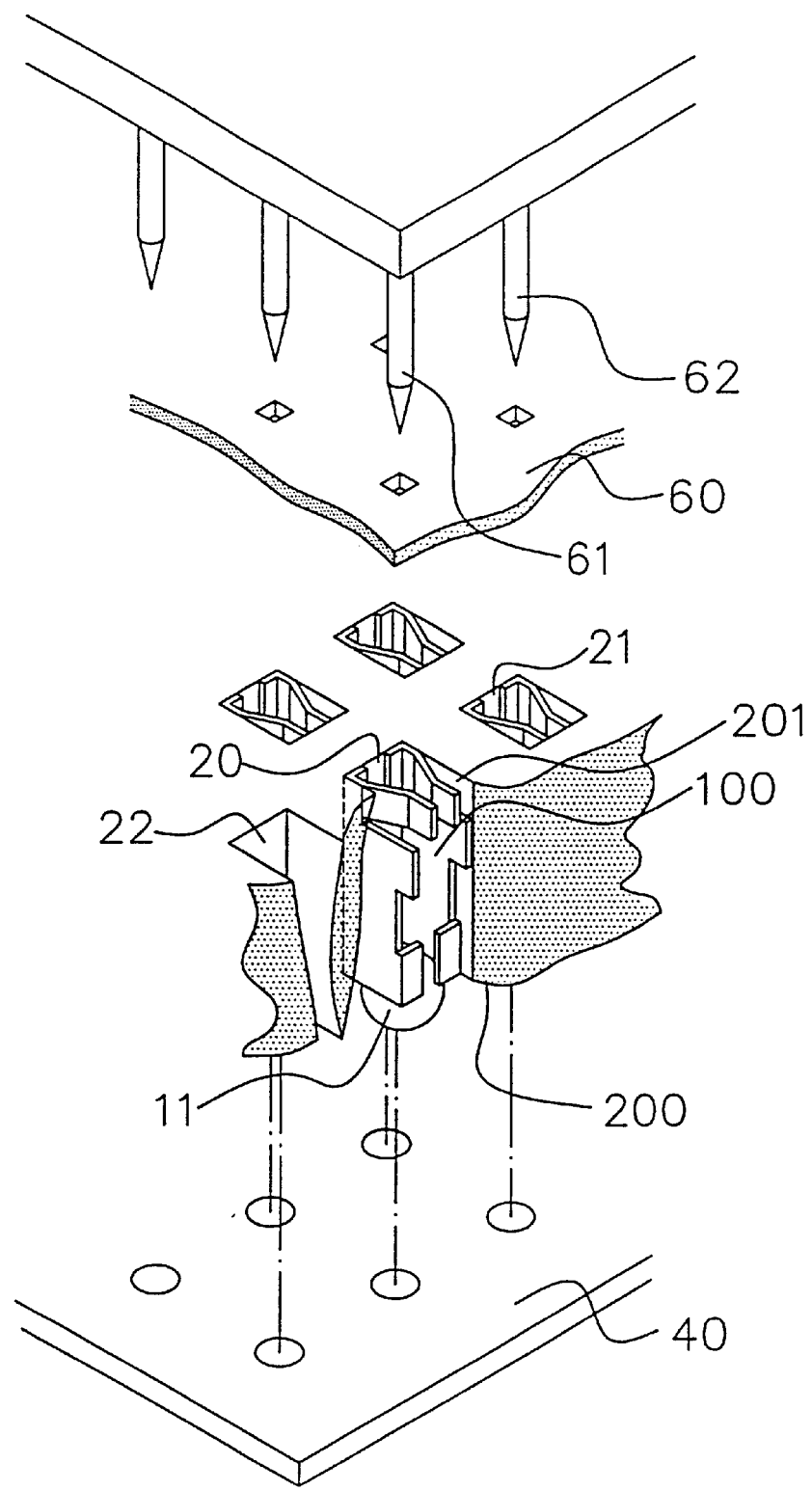
FIG. 8 is a perspective view showing the connection of the solder ball with the Ball Grid Array IC socket of the present invention.

FIGS. 6 and 7 are sectional views of the Ball Grid Array IC socket. As shown in the figures, the top face and the surrounding of the solder ball 11 are enclosed and fastened and the solder ball 11 is not easily dislocated. As shown in FIG. 8, the external of the cylindrical tube 100 has the size of the through slots 20, 21, 22 of the CPU socket 10 and is fully inserted therein, and about half the height of the solder ball 11 is protruded above the socket 10. When the entire structure with the solder ball 11 is placed onto a circuit board 40, the solder ball 11 will be adhered onto the circuit board 40 by heating. The clipping surface of the solder ball 11 will be melted and adhered to the inner wall of the cylindrical tube 100 and the bottom face of the blocking plate 102. Thus, a good conductivity circuit board is obtained.

Figures 9, 10:
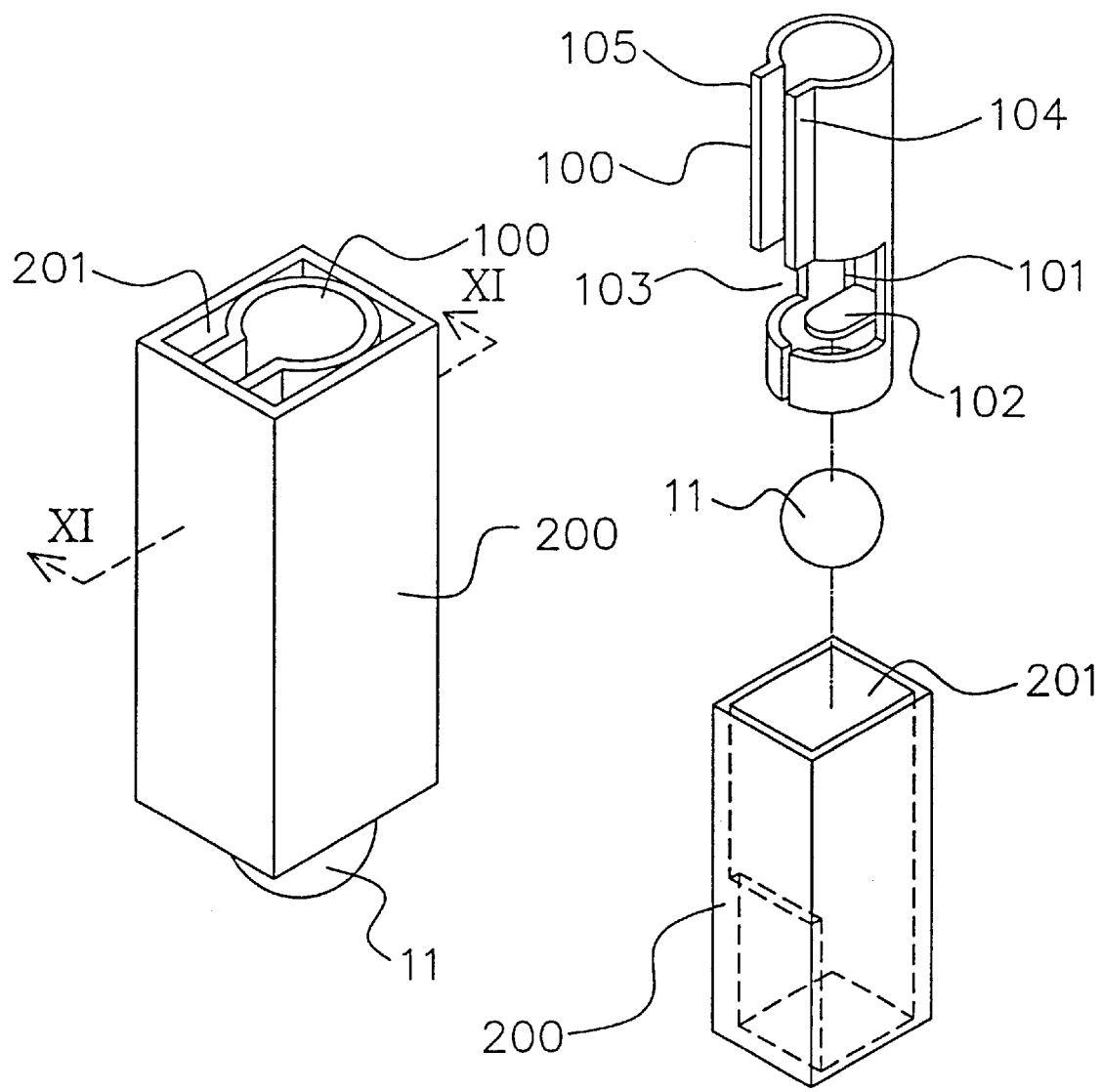
FIG. 9 is a perspective view showing the connection of another type of conductive clipping plate of the solder ball with the Ball Grid Array IC socket in accordance with the present invention.
FIG. 10 is a perspective exploded view showing the connection of another type of conductive clipping plate of the solder ball with the Ball Grid Array IC socket in accordance with the present invention.

Referring to FIG. 9, the slotted cylindrical tube 100 may have a rounded tubular body. As shown in FIG. 10, the tube opening of the other end of the cylindrical tube for mounting the IC pin has a size which can tightly clip and hold the wall of the solder ball 11 such that a tight connection is obtained at the tube opening mounted with the solder ball 11. A slit 101 is formed at an appropriate height on the wall of the cylindrical tube 100 and a blocking plate 102 is extended outward from the wall of the cylindrical tube 100 which can sit onto the top edge portion of the solder ball 11. At the same time, the through slot 103, clipping walls 104, 105 are also formed. As shown in FIG. 11, there is shown the sectional view of the Ball Grid Array CPU socket of the present invention, wherein the surrounding of the solder ball 11 is enclosed and fastened and the solder ball 11 cannot be easily dislocated.

While the invention has been described with respect to preferred embodiment, it will be clear to those skilled in the art that modifications and improvements may be made to the invention without departing from the spirit and scope of the invention. Therefore, the invention is not to be limited by the specific illustrative embodiment, but only by the scope of the appended claims.

I claim:

1. A structure of a ball grid array IC connection with solder balls comprising a socket having a plurality of through slots, a plurality of conductive plates each fitted into one of said through slots, wherein each of said conductive plate is a bendable, flexible conductive thin plate having an upper end formed into two opposed clipping walls for insertion and clipping of IC pins and a lower end formed into a rectangular tube with a slot, said rectangular tube being formed with an inwardly extending blocking plate such that a solder ball is snugly fitted into said rectangular tube thereby causing a top of said solder ball to contact said blocking plate and said solder ball to be held by three inner sides of said rectangular tube and said slot of said rectangular tube, said blocking plate being located at a height equal to one-half of height of said solder ball.

* * * * *